US006831298B2

United States Patent
Park et al.

(10) Patent No.: US 6,831,298 B2
(45) Date of Patent: Dec. 14, 2004

(54) DUAL PANEL-TYPE ORGANIC ELECTROLUMINESCENT DISPLAY DEVICE

(75) Inventors: Jae-Yong Park, Gyeonggi-do (KR); Choong-Keun Yoo, Incheon (KR); Ock-Hee Kim, Gyeonggi-do (KR); Nam-Yang Lee, Gyeonggi-do (KR); Kwan-Soo Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/620,591

(22) Filed: Jul. 17, 2003

(65) Prior Publication Data

US 2004/0069986 A1 Apr. 15, 2004

(30) Foreign Application Priority Data

Jul. 18, 2002 (KR) .................. 10-2002-0041939

(51) Int. Cl.[7] ................ H01L 29/04; H01L 31/036; H01L 31/0376; H01L 31/20

(52) U.S. Cl. .............. 257/59; 257/72; 257/88; 257/98

(58) Field of Search .............. 257/40, 59, 72, 257/88, 98, 347; 313/504, 512

(56) References Cited

U.S. PATENT DOCUMENTS 6,515,428 B1 * 2/2003 Yeh et al. .............. 315/169.3

* cited by examiner

Primary Examiner—Thien F Tran
(74) Attorney, Agent, or Firm—Morgan Lewis & Bockius LLP

(57) ABSTRACT

A dual panel-type organic electroluminescent display device includes a first substrate and a second substrate bonded together to include a plurality of sub-pixel regions, a first electrode on an inner surface of the second substrate, an insulating pattern on the first electrode along a border portion between adjacent sub-pixel regions, a plurality of partition walls on the insulating pattern, a plurality of organic electroluminescent layers, each within one of the sub-pixel regions between adjacent partition walls, a second electrode on the organic electroluminescent layer, a plurality of thin film transistors on an inner surface of the first substrate each within one of the sub-pixel regions, and including a semiconductor layer, a gate electrode, a source electrode, and a drain electrode, a passivation layer covering the thin film transistors and including a contact hole exposing the drain electrode, and a plurality of connection patterns on the passivation layer, each including a first pattern and a second pattern, wherein the first pattern corresponds to the second electrode and has a height larger than a height of the partition walls and the second pattern covers the first pattern and is connected to the drain electrode and the second electrode.

20 Claims, 6 Drawing Sheets

DUAL PANEL-TYPE ORGANIC ELECTROLUMINESCENT DISPLAY DEVICE

The present invention claims the benefit of Korean Patent Application No. P2002-041939 filed in Korea on Jul. 18, 2002, which is hereby incorporated by reference.

BACKGROUND OF THE INVENTION

1. Field of the Invention

The present invention relates to an organic electroluminescent display device, and more particularly, to a dual panel-type organic electroluminescent display device.

2. Discussion of the Related Art

Among flat panel displays, liquid crystal display (LCD) devices have been commonly used due to their thin profile, light weight, and low power consumption. However, the LCD devices are not self-luminescent and suffer from low brightness, low contrast ratios, narrow viewing angles, and large overall sizes.

Organic electroluminescent display (OELD) devices have wide viewing angles and excellent contrast ratios because of their self-luminescence. In addition, since the OELD devices do not require additional light sources, such as a backlight, the OELD devices have relatively small sizes, are light weight, and have low power consumption, as compared the LCD devices. Furthermore, the OELD devices can be driven by low voltage direct current (DC) and have short microsecond response times. Since the OELD devices are solid state devices, the OELD devices sufficiently withstand external impact and have greater operational temperature ranges. In addition, the OELD devices may be manufactured at low cost since only deposition and encapsulation apparatus are necessary for manufacturing the OELD devices, thereby simplifying manufacturing processes.

The OELD devices are commonly categorized as top emission-type and bottom emission-type according to a direction of the emitted light. Furthermore, the OELD devices may be categorized as one of passive matrix-type OELD devices and active matrix-type OELD devices depending upon methods of driving the devices. The passive matrix-type OELD devices are commonly used because of their simplicity and ease of fabrication. However, the passive matrix-type OELD devices have scanning lines and signal lines that perpendicularly cross each other in a matrix configuration. Since a scanning voltage is sequentially supplied to the scanning lines to operate each pixel, an instantaneous brightness of each pixel during a selection period should reach a value resulting from multiplying an average brightness by the number of the scanning lines to obtain a required average brightness. Accordingly, as the number of the scanning lines increases, the applied voltage and current also increase. Thus, the passive matrix-type OELD devices are not adequate for high resolution display and large-sized displays since the devices easily deteriorate during use, and power consumption is high.

Since the passive matrix-type OELD devices have many disadvantages with regard to image resolution, power consumption, and operational lifetime, the active matrix-type OELD device have been developed to produce high image resolution in large area displays. In the active matrix-type OELD devices, thin film transistors (TFTs) are disposed at each sub-pixel to function as a switching element to turn each sub-pixel ON and OFF. Accordingly, a first electrode connected to the TFT is turned ON/OFF by the sub-pixel, and a second electrode facing the first electrode functions as a common electrode. In addition, a voltage supplied to the pixel is stored in a storage capacitor, thereby maintaining the voltage and driving the device until a voltage of next frame is supplied, regardless of the number of the scanning lines. As a result, since an equivalent brightness is obtained with a low applied current, an active matrix-type OELD device has low power consumption and high image resolution over a large area.

FIG. 1 is a schematic circuit diagram of a pixel structure of an active matrix-type OELD device according to the related art. In FIG. 1, a scanning line 1 is arranged along a first direction, and a signal line 2 and a power line 3 that are spaced apart from each other are arranged along a second direction perpendicular to the first direction. The signal line 2 and the power line 3 cross the scanning line 1, thereby defining a pixel area. A switching thin film transistor (TFT) $T_S$, i.e., an addressing element, is connected to the scanning line 1 and the signal line 2, and a storage capacitor $C_{ST}$ is connected to the switching TFT $T_S$ and the power line 3. A driving thin film transistor (TFT) $T_D$, i.e., a current source element, is connected to the storage capacitor $C_{ST}$ and the power line 3, and an organic electroluminescent (EL) diode $D_{EL}$ is connected to the driving TFT $T_D$. When a forward current is supplied to the organic EL diode $D_{EL}$, an electron and a hole are recombined to generate an electron-hole pair through the P(positive)-N(negative) junction between an anode, which provides the hole, and a cathode, which provides the electron. Since the electron-hole pair has an energy that is lower than the separated electron and hole, an energy difference exists between the recombination and the separated electron-hole pair, whereby light is emitted due to the energy difference.

FIG. 2 is a cross sectional view of a bottom emission-type organic electroluminescent display (OELD) device according to the related art. In FIG. 2, first and second substrates 10 and 30 are bonded together by a seal pattern 40, wherein one pixel region is shown to include red, green, and blue sub-pixel regions. A thin film transistor (TFT) T is formed at each sub-pixel region $P_{sub}$ on an inner surface of the first substrate 10, and a first electrode 12 is connected to the TFT T. An organic electroluminescent layer 14 includes luminescent materials of red, green, and blue and is formed on the TFT T. In addition, the first electrode 12 and a second electrode 16 are formed on the organic electroluminescent layer 14, whereby the first and second electrodes 12 and 16 induce an electric field to the organic electroluminescent layer 14. A desiccant (not shown) is formed in an inner surface of the second substrate 30 to shield an internal portion of the OELD device from external moisture. The desiccant is attached to the second substrate 30 by an adhesive (not shown), such as semi-transparent tape.

In the bottom emission-type OELD device, for example, the first electrode 12 functions as an anode and is made of a transparent conductive material, and the second electrode 16 functions as a cathode and is made of a metallic material of low work function. Accordingly, the organic electroluminescent layer 14 is composed of a hole injection layer 14a, a hole transporting layer 14b, an emission layer 14c, and an electron transporting layer 14d formed over the first electrode 12. The emission layer 14c has a structure where emissive materials of red, green, and blue are alternately disposed at each sub-pixel region $P_{sub}$.

FIG. 3 is a cross sectional view of a sub-pixel region of a bottom emission-type organic electroluminescent display device according to the related art. In FIG. 3, a TFT T having a semiconductor layer 62, a gate electrode 68, and source and drain electrodes 80 and 82 is formed on a substrate 10. The source electrode 80 of the TFT T is connected to a storage capacitor $C_{ST}$, and the drain electrode 82 is connected to an organic electroluminescent (EL) diode $D_{EL}$. The storage capacitor $C_{ST}$ includes a power electrode 72 and a capacitor electrode 64 that face each other with an insulating layer interposed between the power electrode 72 and the capacitor electrode 64, wherein the capacitor electrode 64 is made of the same material as the semiconductor layer 62. The TFT T and the storage capacitor $C_{ST}$ are commonly referred to as array elements A. The organic EL diode $D_{EL}$ includes first and second electrodes 12 and 16 that face each other with an organic EL layer 14 interposed therebetween. The source electrode 80 of the TFT T is connected to the power electrode 72 of the storage capacitor $C_{ST}$, and the drain electrode 82 of the TFT T is connected to the first electrode 12 of the organic EL diode $D_{EL}$. In addition, the array elements A and the organic EL diode $D_{EL}$ are formed on the same substrate.

FIG. 4 is a flow chart of a fabricating process of an organic electroluminescent display device according to the related art. At step ST1, array elements are formed on a first substrate that include a scanning line, a signal line, a power line, a switching TFT, and a driving TFT. The signal line and the power line cross the scanning line and are spaced apart from each other. The switching TFT is disposed at a cross of the scanning line and the signal line, while the driving TFT is disposed at a cross of the scanning line and the power line.

At step ST2, a first electrode of an organic EL diode is formed over the array elements. The first electrode is connected to the driving TFT of each sub-pixel region.

At step ST3, an organic electroluminescent layer of the organic EL diode is formed on the first electrode. If the first electrode is designed to function as an anode, the organic EL layer can be composed of a hole injection layer, a hole transporting layer, an emission layer, and an electron transporting layer.

At step ST4, a second electrode of the EL diode is formed on the organic EL layer. The second electrode is formed over an entire surface of the first substrate to function as a common electrode.

At step ST5, the first substrate is encapsulated with a second substrate. The second substrate protects the first substrate from external impact and prevents damage to the organic EL layer from any ambient air. A desiccant may be included in an inner surface of the second substrate.

The OELD device is fabricated through encapsulating the first substrate including the array elements and the organic EL diode with the second substrate. In addition, a yield of the active matrix OELD device depends on individual yields of the thin film transistor and the organic layer. Although the thin film transistor may adequately function, the yield of the active matrix OELD device varies due to the incorporation of impurities during the process of forming the organic layer to a thickness of about 1,000 Å. Accordingly, the yield of the active matrix OELD is reduced because of the impurities, and results in a loss of manufacturing costs and source materials.

In addition, the active matrix OELD device is a bottom emission-type device having high stability and variable degrees of freedom during the fabrication process, but has a reduced aperture ratio. Thus, the bottom emission-type active matrix OELD device is problematic in implementation as a high aperture device. On the other hand, a top emission-type active matrix OELD has a high aperture ratio, and is easily fabricated. However, in the top emission-type active matrix OELD device, a choice of a material for the cathode electrode is limited since a cathode electrode is generally disposed over the organic layer. Accordingly, light transmittance is limited, and a luminous efficacy is reduced. Furthermore, in order to improve the transmittance, since a passivation layer should be formed in a thin film, air infiltration is not sufficiently prevented.

SUMMARY OF THE INVENTION

Accordingly, the present invention is directed to a dual panel-type organic electroluminescent device that substantially obviates one or more of the problems due to limitations and disadvantages of the related art.

An object of the present invention is to provide a dual panel-type organic electroluminescent display device having improved productivity.

Another object of the present invention is to provide a dual panel-type organic electroluminescent display device having high resolution and high aperture ratio due to top emission.

Another object of the present invention is to provide a dual panel-type organic electroluminescent display device that prevents undesirable short between elements.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a dual panel-type organic electroluminescent display device includes a first substrate and a second substrate bonded together to include a plurality of sub-pixel regions, a first electrode on an inner surface of the second substrate, an insulating pattern on the first electrode along a border portion between adjacent sub-pixel regions, a plurality of partition walls on the insulating pattern, a plurality of organic electroluminescent layers, each within one of the sub-pixel regions between adjacent partition walls, a second electrode on the organic electroluminescent layer, a plurality of thin film transistors on an inner surface of the first substrate each within one of the sub-pixel regions, and including a semiconductor layer, a gate electrode, a source electrode, and a drain electrode, a passivation layer covering the thin film transistors and including a contact hole exposing the drain electrode, and a plurality of connection patterns on the passivation layer, each including a first pattern and a second pattern, wherein the first pattern corresponds to the second electrode and has a height larger than a height of the partition walls and the second pattern covers the first pattern and is connected to the drain electrode and the second electrode.

In another aspect, a dual panel-type organic electroluminescent display device includes a first substrate and a second substrate bonded together having a plurality of sub-pixel regions, a first electrode on an inner surface of the second substrate, an insulating pattern on the first electrode along a border portion between adjacent sub-pixel regions, a plurality of partition walls on the insulating pattern, a plurality of organic electroluminescent layers, each at one of sub-pixel regions between adjacent partition walls, a second electrode on the organic electroluminescent layer, a semiconductor layer on an inner surface of the first substrate in the sub-pixel regions, and including an active region, a source region, and a drain region, a gate insulating layer on the active region of the semiconductor layer, a gate electrode on the gate insulating layer, a passivation layer covering the gate electrode and including a first contact hole exposing a portion of the source region and a second contact hole exposing a portion of the drain region, a plurality of first patterns on the passivation layer, each of the first patterns corresponding to the second electrode and having a height greater than a height of the partition walls, a source electrode on the passivation layer and connected to the source region through the first contact hole, a drain electrode on the passivation layer and connected to the drain region through the second contact hole, and a second pattern covering the first pattern, the second pattern contacting the drain electrode and the second electrode, wherein the semiconductor layer, the gate electrode, the source electrode, and the drain electrode constitute a thin film transistor, and the first pattern and the second pattern constitute a connection pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the illustrated embodiments of the present invention, an example of which is illustrated in the accompanying drawings.

Figure 1:
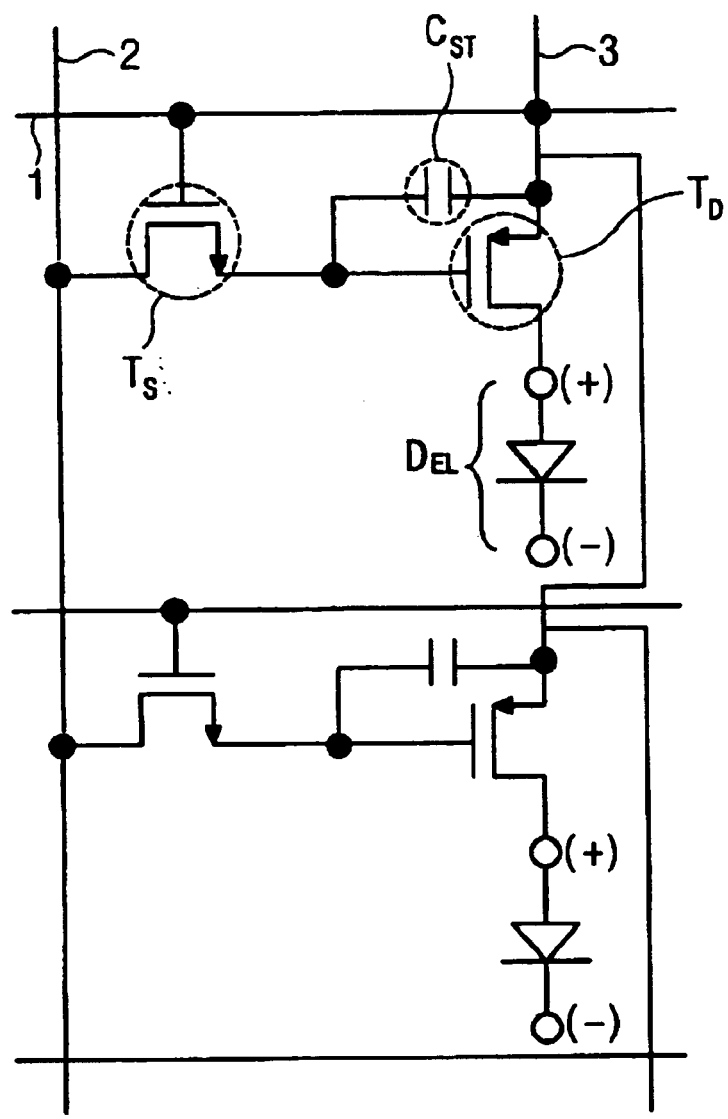
FIG. 1 is a schematic circuit diagram of a pixel structure of an active matrix-type organic electro-luminescent display (OELD) device according to the related art.
Figure 2:
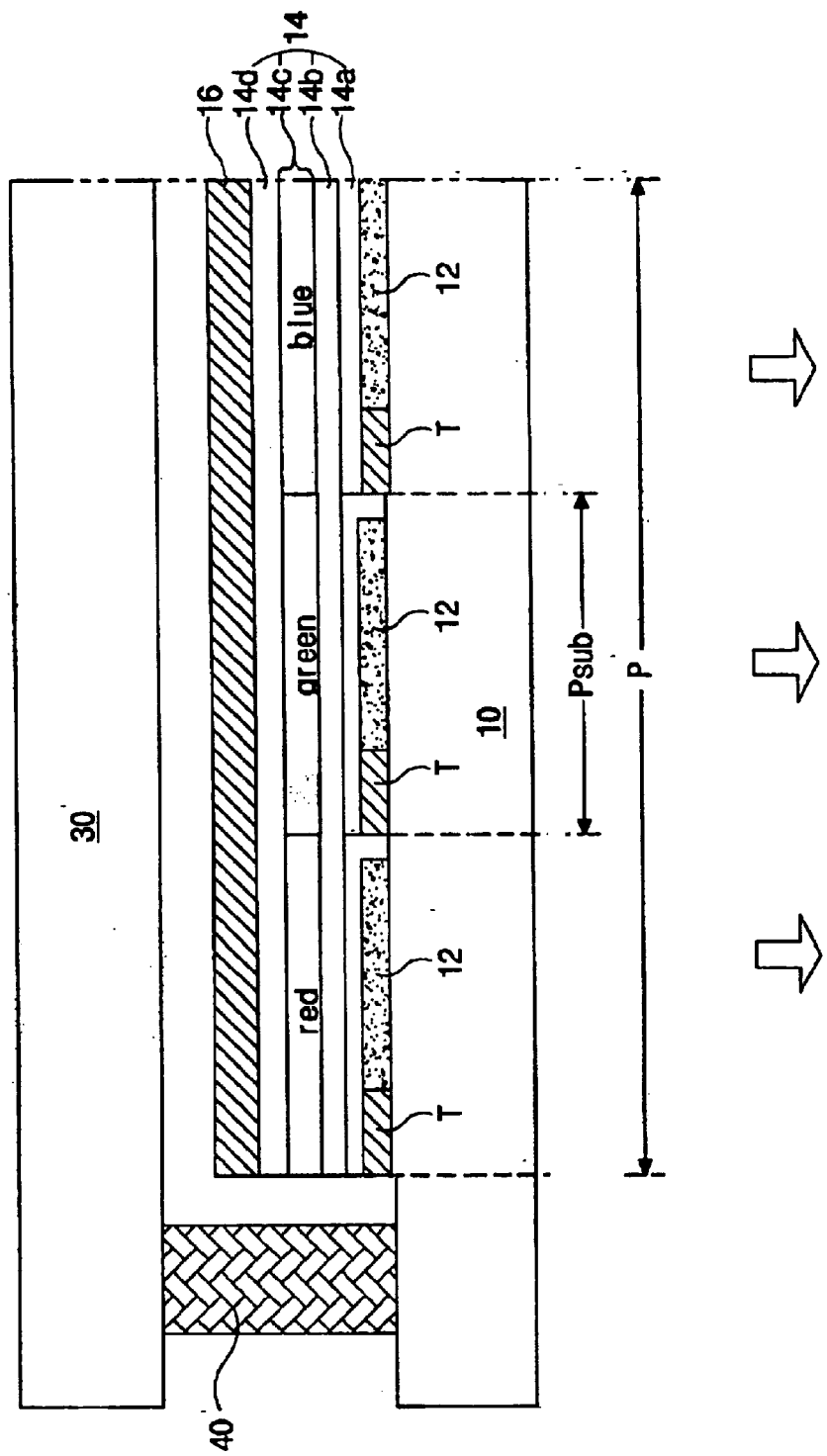
FIG. 2 is a cross sectional view of a bottom emission-type OELD device according to the related art.
Figure 3:
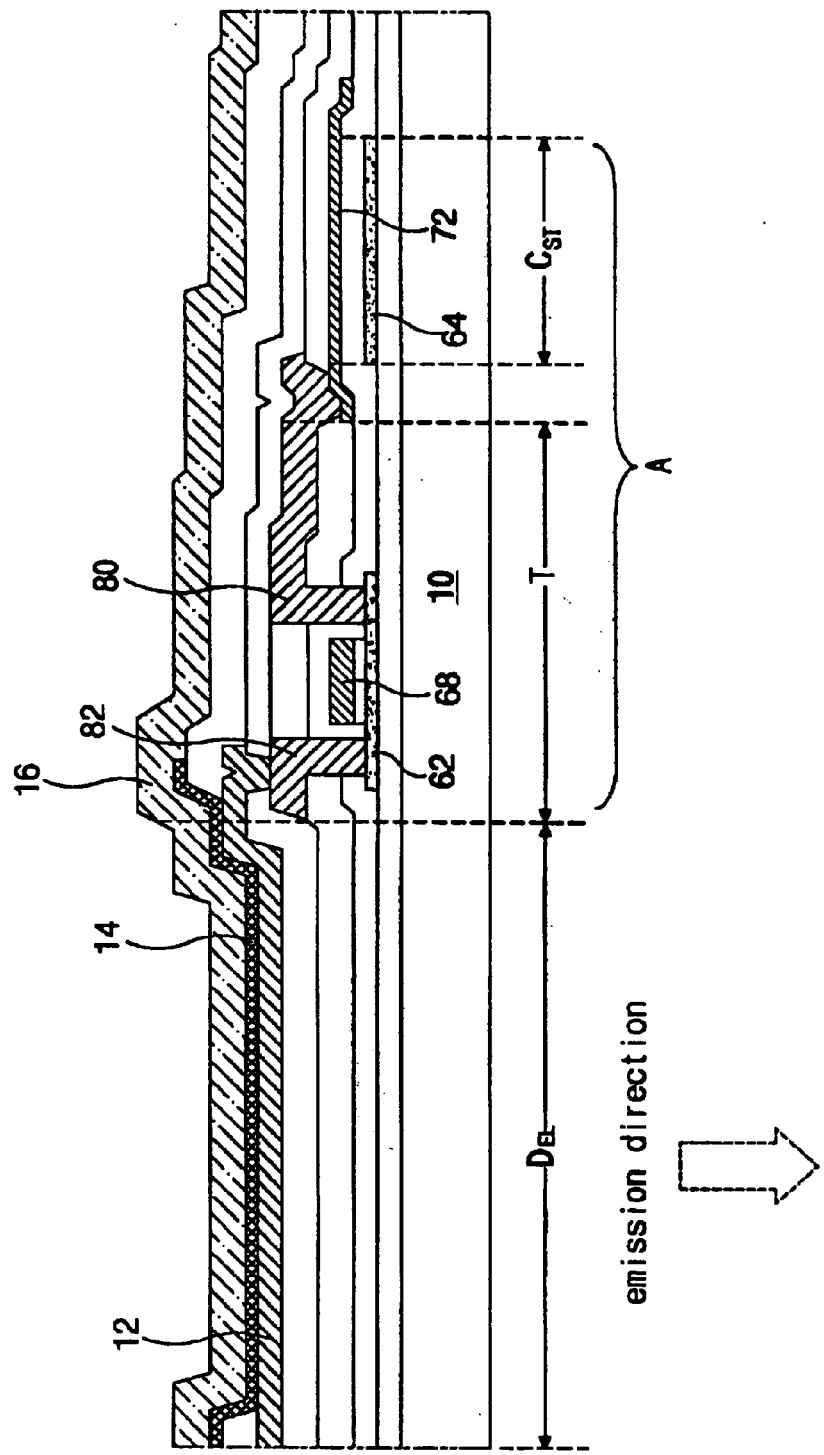
FIG. 3 is a cross sectional view of a sub-pixel region of a bottom emission-type OELD device according to the related art.
Figure 4:
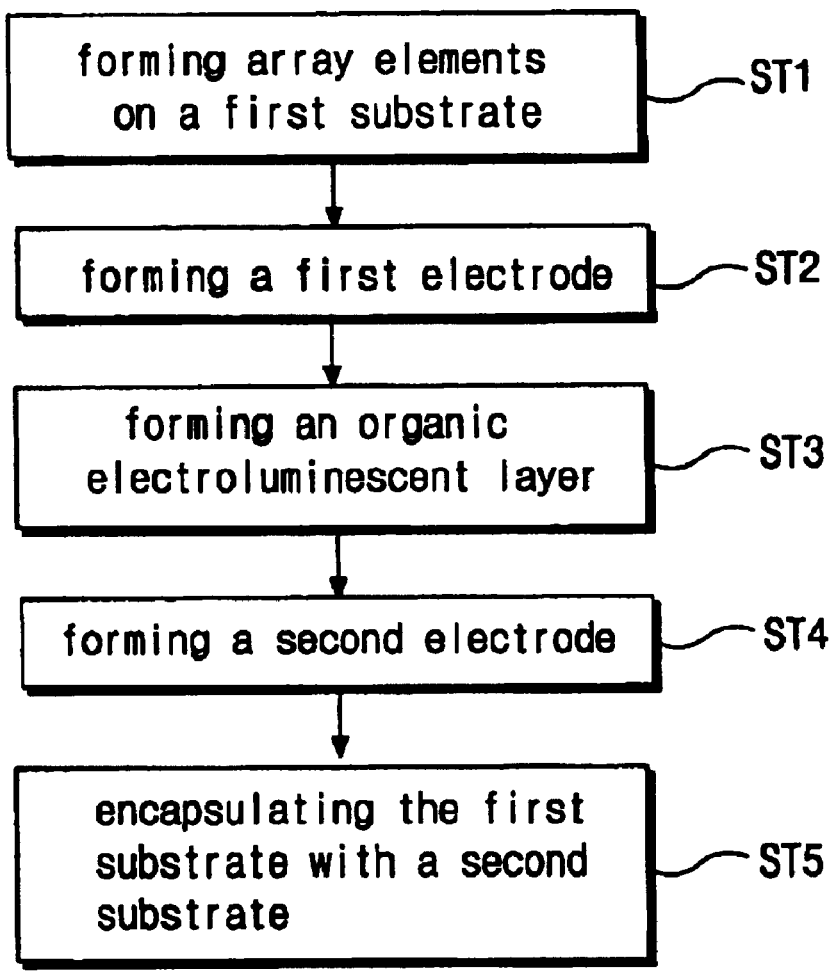
FIG. 4 is a flow chart of a fabricating process of an OELD device according to the related art.
Figure 5:
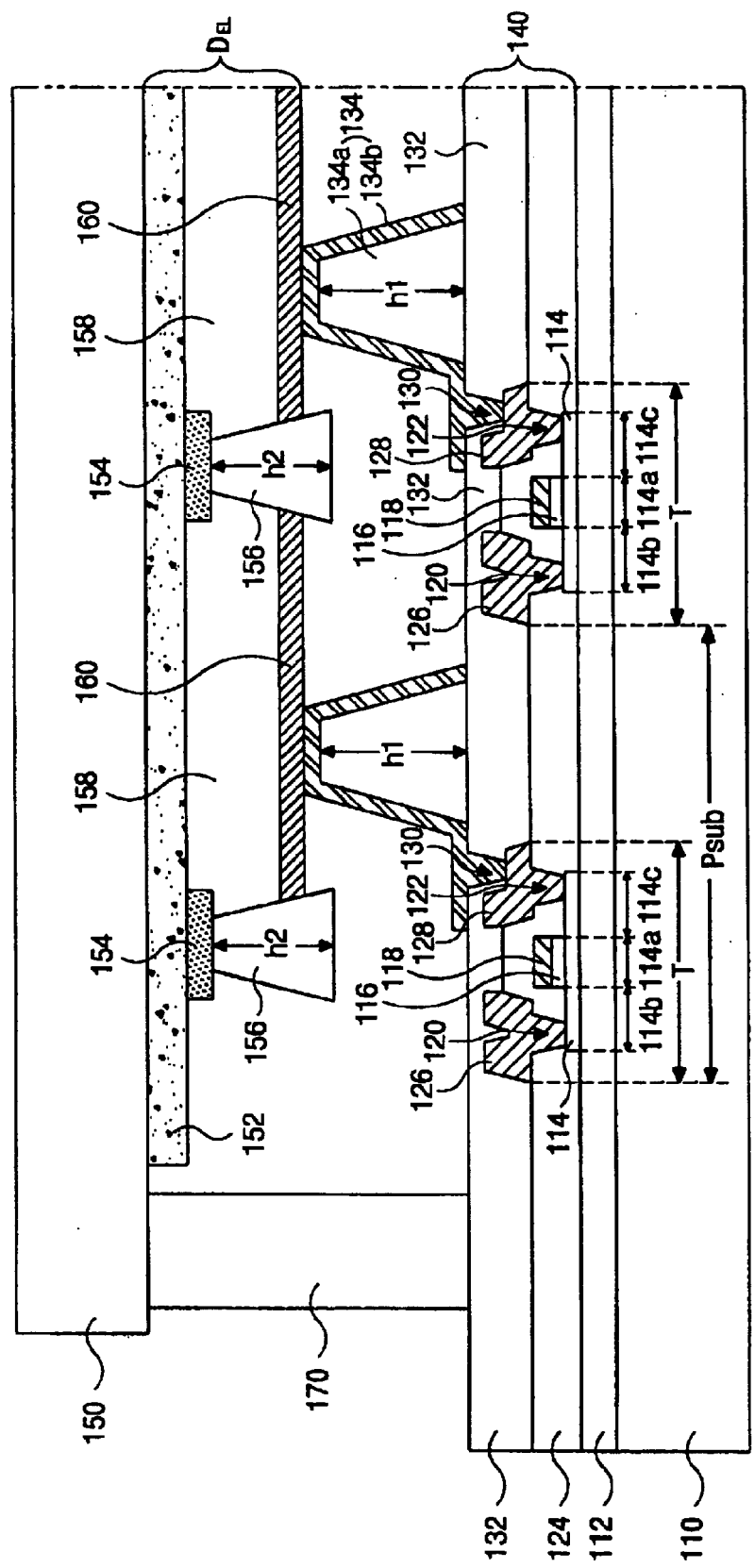
FIG. 5 is a cross sectional view of an exemplary dual panel-type OELD device according to the present invention.

FIG. 5 is a cross sectional view of a dual panel-type organic electroluminescent display device according to the present invention, and shows exemplary driving TFTs. In addition, a storage capacitor and a switching TFT may have the structures of FIG. 1.

In FIG. 5, a first substrate 110 and a second substrate 150 may be spaced apart and bonded to each other. Array element layers 140 may include a plurality of thin film transistors T each provided within one of a plurality of sub-pixels $P_{sub}$ formed on an inner surface of the first substrate 110. In addition, a connection pattern 134 having a columnar shape may be connected to one of the thin film transistors T.

In addition, a first electrode 152 may be formed on an inner surface of the second substrate 150. An insulating pattern 154 and a plurality of partition walls 156 may be sequentially formed on the first electrode 152 and may be disposed along a border portion between adjacent sub-pixels $P_{sub}$. The partition walls 156 may have trapezoid shapes that includes a first side contacting the insulating pattern 154 and a second side, which may be wider than the first side such that the first side and the second side may be parallel to each other.

A plurality of organic EL layers 158 and a second electrode 160 may be subsequently formed on the first electrode 152 between the adjacent partition walls 156 at each sub-pixel $P_{sub}$. The organic EL layers 158 and the second electrode 160 may be formed without patterning processes such as photolithographic processes due to the partition walls 156. Although not shown in the figure, the partition walls 156 may have a frame structure corresponding to the border portion between adjacent sub-pixels $P_{sub}$ in a plan view. In addition, the second electrode 160 may be connected to each a plurality of connection patterns 134, and a seal pattern 170 may be formed along a peripheral portion between the first and second substrates 110 and 150.

The first electrode 152, the second electrode 160, and one of the organic EL layers 158 may constitute an organic EL diode $D_{EL}$. Accordingly, the first electrode 152 may include transparent conductive material(s), wherein light from the organic EL layers 158 may be emitted through the first electrode 152. Thus, the OELD device may function as a top emission-type device.

The array element layers 140 may include a buffer layer 112 formed on an entire surface of the first substrate 110 and a semiconductor layer 114, which may be composed of an active region 114a and source and drain regions 114b and 114c disposed at both sides of the active region 114a, respectively, may be formed on the buffer layer 112 within the sub-pixels $P_{sub}$. Then, a gate insulating layer 116 and a gate electrode 118 may be sequentially formed on the active region 114a of the semiconductor layer 114. A first passivation layer 124 may be formed on an entire surface of the substrate 110 to cover the gate electrode 118, wherein a first contact hole 120 and a second contact hole 122 exposing the source region 114b and the drain region 114c of the semiconductor layer 114, respectively may be formed. A source electrode 126 and a drain electrode 128 may be formed on the first passivation layer 124, wherein the source electrode 126 may be connected to the source region 114b of the semiconductor layer 114 through the first contact hole 120 and the drain electrode 128 may be connected to the drain region 114b of the semiconductor layer 114 through the second contact hole 122.

Next, a second passivation layer 132 may be formed on an entire surface of the first substrate 110 to cover the source and drain electrodes 126 and 128, wherein a third contact hole 130 may be formed to expose the drain electrode 128. Each of the connection patterns 134 may include a first pattern 134a and a second pattern 134b, and may be formed on the second passivation layer 132. The first pattern 134a is adjacent to the third contact hole 130 and may be of a spacer shape having a fixed height. The second pattern 134b may cover the first pattern 134a and may be connected to the drain electrode 128 through the third contact hole 130. Thus, each of the connection patterns 134 are connected to the second electrode 160, thereby transmitting current from the drain electrode 128 to the second electrode 160. The semiconductor layer 114, the gate electrode 118, the source electrode 126, and the drain electrode 128 may constitute the driving thin film transistor T.

Although not shown in the figure, a storage capacitor may be connected to the driving thin film transistor T, and the gate electrode 118 of the driving thin film transistor T may be connected to a drain electrode of a switching thin film transistor (not shown).

In addition, the organic EL layers 158 may emit light of one color of red, green, and blue disposed in each sub-pixel $P_{sub}$, that are separated by the partition walls 156, wherein three sub-pixels $P_{sub}$ of red, blue, and green may form a pixel.

In FIG. 5, each of the connection patterns 134 connected to the drain electrode 128 of the driving thin film transistor T may be formed by forming the first pattern 134a, which has a thickness so that the height of the connection patterns 134 may be uniform and may function as a spacer, and then by forming a second pattern 134b that is made of a conductive material and covers the first pattern 134a. Accordingly, the second electrode 160 may be connected to the drain electrode 128 through the second pattern 134b.

Accordingly, a height h1 of the first pattern 134a may be larger than a height h2 of the partition wall 156, which maintain a space between the first and second substrates 110 and 150. The organic EL layers 158 and the second electrode 160 may be patterned between the adjacent partition walls 156 in each of the sub-pixels $P_{sub}$, wherein the partition walls 156 may function as a separator. Accordingly, since an organic EL layer material and a second electrode material may remain along side portions of the partition walls 156 adjacent to the first substrate 110, an electrical short between main elements of the first and second substrates 110 and 150 may occur due to the height effects of the partition wall 156, the organic EL layer material, and the second electrode material. Thus, in order to prevent the electrical short, the first pattern 134a of the connection pattern 134 may be higher than the partition walls 156.

The first pattern 134a may be selected from insulating materials, and a photoresist material may be used and patterned through photolithographic processes. In addition to the photoresist, an organic material, such as photo acryl and polyimide, may be used, wherein the first pattern 134a may be formed as to have tapered side portions using the organic material.

Figure 6:
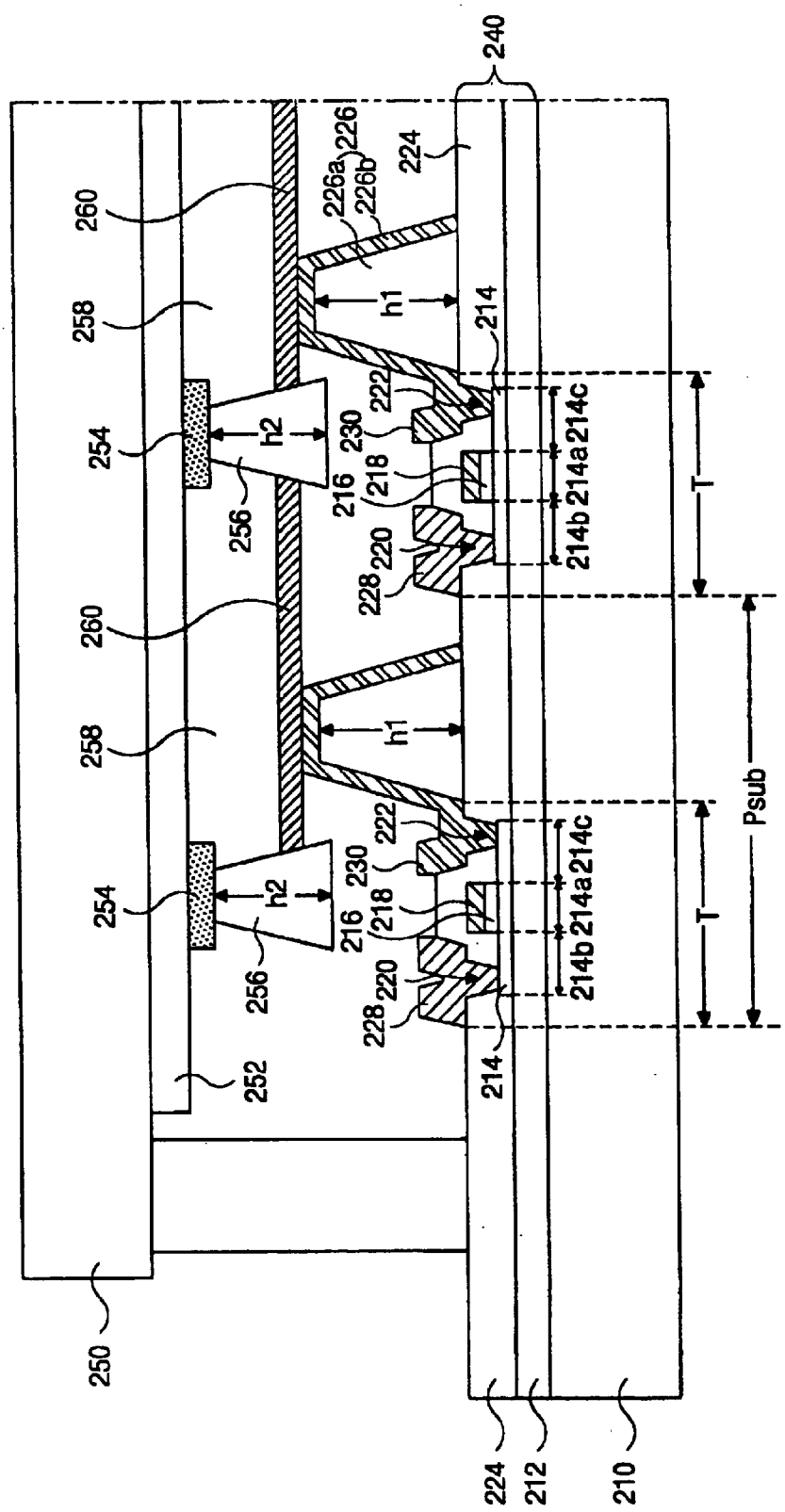
FIG. 6 is a cross sectional view of another exemplary dual panel-type OELD device according to the present invention.

FIG. 6 is a cross sectional view of another exemplary dual panel-type OELD device according to the present invention. In FIG. 6, a first substrate 210 and a second substrate 250, which may include a plurality of sub-pixels $P_{sub}$, may be spaced apart and bonded together. A plurality of array element layers 240 including a thin film transistor T may be formed within each of the sub-pixels $P_{sub}$, and may be formed on an inner surface of the first substrate 210. Then, a first electrode 252 may be formed entirely on an inner surface of the second substrate 250, wherein an insulating pattern 254 and a partition wall 256 may be sequentially formed on the first electrode 252 and may be disposed along a border portion between adjacent sub-pixels $P_{sub}$. The partition walls 256 may have trapezoidal shapes, wherein a first side portion may contact the insulating pattern 254 and a second side portion may be wider than the first side portion. A plurality of organic EL layers 258 and a second electrode 260 may be subsequently formed on the first electrode 252 between the adjacent partition walls 256 in each of the sub-pixels $P_{sub}$. In addition, a seal pattern (not shown) may be formed along a peripheral portion between the first and second substrates 210 and 250.

In FIG. 6, a buffer layer 212 may be formed on an inner surface of the first substrate 210 and a semiconductor layer 214, which may be composed of an active region 214a and source and drain regions 214b and 214c disposed at both sides of the active region 214a, respectively, may be formed on the buffer layer 212 within the sub-pixels $P_{sub}$. In addition, a gate insulating layer 216 and a gate electrode 218 may be sequentially formed on the active region 214a of the semiconductor layer 214. A passivation layer 224 may be formed on an entire surface of the substrate 210 to cover the gate electrode 218, and may have a first contact hole 220 and a second contact hole 222 exposing the source region 214b and the drain region 214c of the semiconductor layer 214, respectively.

A first pattern 226a having a fixed thickness functioning as a spacer may be formed on the passivation layer 224 in the sub-pixels $P_{sub}$. Then, a source electrode 228, a drain electrode 230, and a second pattern 226b may be formed on the passivation layer 224 and the first pattern 226a. The source electrode 228 may be connected to the source region 214b of the semiconductor layer 214 through the first contact hole 220 and the drain electrode 230 may be connected to the drain region 214b of the semiconductor layer 214 through the second contact hole 222. Accordingly, the second pattern 226a may be formed as a single structure with the drain electrode 230, and may cover the first pattern 226a.

The first pattern 226a and the second pattern 226b may constitute a connection pattern 226, wherein the second pattern 226b of the connection pattern 226 may contact the second electrode 260. The semiconductor layer 214, the gate electrode 218, the source electrode 228, and the drain electrode 230 may constitute the driving thin film transistor T. Accordingly, a height h1 of the first pattern 226a may be larger than a height h2 of the partition walls 256.

According to the present invention, since the second pattern may be simultaneously formed in a process of forming the source and drain electrodes, the manufacturing processes for forming the device in FIG. 6 may be reduced, as compared with the device in FIG. 5. In addition, the present invention may have the following advantages. First, productivity and production control efficiency of the device may be improved, whereby an operational lifetime of the device may be increased. Second, since the OELD device is a top emission-type, the thin film transistor may be easily designed, and high aperture ratios and high image resolution may be achieved. Third, the OELD device may be stable from air infiltration since the device is a top emission-type and is an encapsulated structure. Fourth, since the connection pattern for connecting the array element and the organic EL element may be formed to include a pattern that provides a height control, failure rates of the device may be lowered. Fifth, the manufacturing process may be simplified since the connection pattern may be formed to extend from an electrode of the driving thin film transistor.

It will be apparent to those skilled in the art that various modifications and variations can be made in the organic electroluminescent display device and the method of fabricating the organic electroluminescent display device of the present invention without departing from the spirit or scope of the inventions. Thus, it is intended that the present invention covers the modifications and variations of this invention provided they come within the scope of the appended claims and their equivalents.

What is claimed is:

1. A dual panel-type organic electroluminescent display device, comprising:

a first substrate and a second substrate bonded together to include a plurality of sub-pixel regions;

a first electrode on an inner surface of the second substrate;

an insulating pattern on the first electrode along a border portion between adjacent sub-pixel regions;

a plurality of partition walls on the insulating pattern;

a plurality of organic electroluminescent layers, each within one of the sub-pixel regions between adjacent partition walls;

a second electrode on the organic electroluminescent layer;

a plurality of thin film transistors on an inner surface of the first substrate each within one of the sub-pixel regions, and including a semiconductor layer, a gate electrode, a source electrode, and a drain electrode;

a passivation layer covering the thin film transistors and including a contact hole exposing the drain electrode; and a plurality of connection patterns on the passivation layer, each including a first pattern and a second pattern, wherein the first pattern corresponds to the second electrode and has a height larger than a height of the partition walls and the second pattern covers the first pattern and is connected to the drain electrode and the second electrode.

2. The device according to claim 1, wherein light produced by the organic electroluminescent layers is emitted through the first electrode.

3. The device according to claim 1, wherein each of the partition walls have a trapezoidal shape including a first side and a second side parallel to each other such that the first side contacts the insulating pattern and the second side is wider than the first side.

4. The device according to claim 1, wherein the first pattern includes photoresist material and is formed through photolithographic processes.

5. The device according to claim 1, wherein the first pattern includes at least one of photo-acryl and polyimide.

6. The device according to claim 1, further comprising a seal pattern along a peripheral portion between the first and second substrates.

7. The device according to claim 1, wherein the first pattern has tapered sides.

8. The device according to claim 1, wherein the first pattern uniformly maintains a space between the first and second substrates.

9. The device according to claim 1, wherein each of the thin film transistors are driving thin film transistors providing current to an organic electroluminescent diode that includes the first electrode, the second electrode, and one of the organic electroluminescent layers.

10. The device according to claim 9, further comprising a switching thin film transistor including a drain electrode, wherein the gate electrode of the driving thin film transistor is connected to the drain electrode of the switching thin film transistor.

11. A dual panel-type organic electroluminescent display device, comprising:

a first substrate and a second substrate bonded together having a plurality of sub-pixel regions;

a first electrode on an inner surface of the second substrate;

an insulating pattern on the first electrode along a border portion between adjacent sub-pixel regions;

a plurality of partition walls on the insulating pattern;

a plurality of organic electroluminescent layers, each at one of sub-pixel regions between adjacent partition walls;

a second electrode on the organic electroluminescent layer;

a semiconductor layer on an inner surface of the first substrate in the sub-pixel regions, and including an active region, a source region, and a drain region;

a gate insulating layer on the active region of the semiconductor layer;

a gate electrode on the gate insulating layer;

a passivation layer covering the gate electrode and including a first contact hole exposing a portion of the source region and a second contact hole exposing a portion of the drain region;

a plurality of first patterns on the passivation layer, each of the first patterns corresponding to the second electrode and having a height greater than a height of the partition walls;

a source electrode on the passivation layer and connected to the source region through the first contact hole;

a drain electrode on the passivation layer and connected to the drain region through the second contact hole; and a second pattern covering the first pattern, the second pattern contacting the drain electrode and the second electrode, wherein the semiconductor layer, the gate electrode, the source electrode, and the drain electrode constitute a thin film transistor, and the first pattern and the second pattern constitute a connection pattern.

12. The device according to claim 11, wherein light from each of the organic electro-luminescent layers is emitted through the first electrode.

13. The device according to claim 11, wherein each of the partition walls have a trapezoidal shape including a first side and a second side parallel to each other such that the first side contacts the insulating pattern and the second side is wider than the first side.

14. The device according to claim 11, wherein the first pattern includes photoresist material and is formed through photolithographic processes.

15. The device according to claim 11, wherein the first pattern includes at least one of photo-acryl and polyimide.

16. The device according to claim 11, further comprising a seal pattern along a peripheral portion between the first and second substrates.

17. The device according to claim 11, wherein the first pattern has tapered sides.

18. The device according to claim 11, wherein the first pattern uniformly maintains a space between the first and second substrates.

19. The device according to claim 11, wherein each of the thin film transistors are driving thin film transistors providing current to an organic electroluminescent diode that includes the first electrode, the second electrode, and one of the organic electroluminescent layers.

20. The device according to claim 17, further comprising a plurality of switching thin film transistors each including a drain electrode, wherein each of the gate electrodes of the driving thin film transistors are connected to one of the drain electrodes of the switching thin film transistors.

* * * * *